(12) United States Patent
Rao et al.

(10) Patent No.: US 8,082,401 B2
(45) Date of Patent: Dec. 20, 2011

(54) SELF-TIMING FOR A MULTI-PORTED MEMORY SYSTEM

(75) Inventors: Hari Rao, San Diego, CA (US); Chang Ho Jung, San Diego, CA (US); Nan Chen, San Diego, CA (US); Sei Seung Yoon, San Diego, CA (US)

(73) Assignee: QUALCOMM Incorporated

( * ) Notice: Subject to any disclaimer, the term of this patent is extended or adjusted under 35 U.S.C. 154(b) by 455 days.

(21) Appl. No.: 12/410,660

(22) Filed: Mar. 25, 2009

(65) Prior Publication Data

US 2010/0250865 A1      Sep. 30, 2010

(51) Int. Cl.
*G06F 12/00* (2006.01)
(52) U.S. Cl. ............. 711/149; 711/E12.001; 713/400
(58) Field of Classification Search .................. None
See application file for complete search history.

(56) References Cited

U.S. PATENT DOCUMENTS

| | | | |
|---|---|---|---|
| 5,566,123 A | 10/1996 | Freidin et al. | |
| 5,596,539 A | 1/1997 | Passow et al. | |
| 6,112,295 A | 8/2000 | Bhamidipati et al. | |
| 6,201,757 B1 | 3/2001 | Ward et al. | |
| 2007/0297266 A1 | 12/2007 | Anvar et al. | |

OTHER PUBLICATIONS

International Search Report and Written Opinion—PCT/US2010/028508, International Search Authority—Korean Intellectual Property Office—Nov. 4, 2010.

*Primary Examiner* — Kevin Verbrugge
(74) *Attorney, Agent, or Firm* — Sam Talpalatsky; Michelle Gallardo; Jonathan T. Velasco (57) ABSTRACT

Multi-ported memory systems (e.g., register files) employ self-timing for operational synchronization. Thus, rather than using a reference clock duty cycle for operational synchronization, as in conventional multi-ported register files, embodiments of the present disclosure employ self-timing for such operational synchronization. According to certain embodiments, self-timing is employed to synchronize all the internal events within the memory so that all the events are spaced in time for appropriate synchronization. For instance, the completion of one event leads to triggering another event, the completion of which leads to triggering another event, and so on. Thus, in one embodiment, the self-timing is achieved by referencing the operational events with the memory (or register file) to each other, rather than to a reference clock duty cycle.

30 Claims, 5 Drawing Sheets

SELF-TIMING FOR A MULTI-PORTED MEMORY SYSTEM

TECHNICAL FIELD

The present disclosure relates generally to multi-ported memory architectures, and more particularly to a multi-ported memory architecture that employs self-timing for synchronization of memory access operations.

BACKGROUND

Multi-ported register files are becoming increasingly prevalent in computing system designs. Multi-ported register files are particularly desirable for high performance computing, which may be implemented within a mobile application, like a cellular telephone, a personal digital assistant (PDA), etc., and/or as may be implemented in stationary applications, such as a mainframe computer, a personal computer (PC), etc. In general, memory systems conventionally have static random access memories (SRAMs), with single read and write ports, whereby a resource can perform either a write or a read at one time (i.e., the resource cannot perform both a read and write at the same time). Many integrated circuit (IC) based register files are implemented using such SRAMs having multiple ports. Such multi-ported SRAMs may have dedicated read and write ports, thus enabling read and write operations to be performed simultaneously via the respective ports.

It is often desirable to have a system where multiple agents (or applications) can access the same memory for performing reads and writes in parallel. As an example, such parallelism is often desirable in graphic processing to enable computations (e.g., pertaining to shades and colors, etc.) to be performed quickly so the user does not perceive a flicker or slowness in graphic transitions, but instead perceives a smooth transition of graphics. To achieve such efficient graphics computations, it becomes desirable to have a central memory with multiple agents being able to access the same, central memory. Accessing the same memory by multiple agents is often desirable because it reduces coherency issues. That is, by accessing the same memory, the multiple agents are assured to be accessing the latest data at that point in time without running into coherency issues, as are often encountered in many hierarchical cache systems.

Multi-ported memories are quite prevalent in current microprocessor architectures because they are used quite often as level zero (or "L0") cache. Conventional multi-ported memories in microprocessors operate based on sequence clocks. In particular, the system may have a clock generator based on phase lock loop (PLL), which generates a very high frequency, very accurate clock signal. The clock signal is supplied to the multi-ported memory, which uses the clock signal as a reference for synchronizing its operations. The clock signal has a periodically repeating high phase and low phase. In conventional multi-ported memories, a memory access operation (e.g., a read or write) may be performed in one phase (e.g., in the high phase) of the clock signal, and in the other phase (e.g., in the low phase) an operation is not performed. Thus, in conventional multi-ported memories, one memory access operation (e.g., a read or write) may be performed on each port per clock cycle.

Accordingly, register files are normally operated based on reference to a synchronization clock. A high-precision clock signal generator is thus required to ensure the proper synchronization of operations by the register files. Because the synchronization is dependent on the reference clock signal, such an implementation is undesirably prone to clock duty cycle, skew, and/or jitter issues. Additionally, because the conventional multi-ported register file implementation operates with reference to a clock signal running at high frequencies, power consumption tends to be very high in such an implementation.

SUMMARY

The present disclosure is directed generally to systems and methods in which multi-ported memory systems (e.g., register files) employ self-timing for operational synchronization. Thus, rather than using a duty cycle of a reference clock signal for operational synchronization, as in the above-mentioned conventional multi-ported register files, embodiments of the present disclosure employ self-timing for such operational synchronization. According to certain embodiments, self-timing is employed to synchronize all the internal events within the memory so that all the events are spaced in time for appropriate synchronization. For instance, the completion of one event leads to triggering another event, the completion of which leads to triggering another event, and so on. Thus, in one embodiment, the self-timing is achieved by referencing the operational events with the memory (or register file) to each other, rather than to a reference clock signal.

Of course, other components of a system may operate with reference to a clock. For instance, a component requesting a memory access operation (e.g., a read or write operation) may be operating with reference to a clock signal. Accordingly, an overall memory access may be synchronized in some respect to a clock signal. However, in embodiments of the present disclosure, the operations performed by the multi-ported memory system in satisfying the memory access requests are self-timed, rather than synchronized with a clock. For instance, as discussed further herein, in certain embodiments the self-timing feature may enable multiple operations to be performed within a given cycle of the clock signal used by other components of the system that would traditionally require multiple cycles to be performed if the multi-ported memory system were also dependent on the clock synchronization. For example, a read and write access to a same memory address may be satisfied in a single clock cycle according to certain embodiments of the present disclosure, as discussed further herein.

Accordingly, embodiments of the multi-ported memory system disclosed herein do not depend on an accurate clock. Embodiments are not dependent on the duty cycle of a clock. Rather, by being self-timed, the multi-ported memory (e.g., register file) implementation may operate as fast as the system can sustain itself. Thus, certain embodiments do not require the multi-ported register file implementation to operate faster than it has to (e.g., in order to maintain synchronization with a high-frequency clock signal used by other system components), and synchronization of the operations in the multi-ported register file is properly maintained.

One potential benefit that certain embodiments of the self-timed multi-ported register file relates to Process Voltage Temperature (PVT) variation. In a conventional implementation that employs a clock for synchronization, PVT variation is a large concern because all operations are based on clock edges and accurate duty cycles. If PVT variation occurs, this may cause the bounds of the clock edges to be crossed, thereby resulting in timing violations. But in certain embodiments of a self-timed multi-ported memory system, an event is launched and then the multi-ported memory waits for the completion of that event before launching another event. So, since the events are self-timed, they automatically track the PVT variation, which alleviates concern over PVT variation.

This and/or other benefits may result from certain embodiments because a phase locked loop (PLL) is not required for internal operations of the multi-ported memory system. For instance, product cost and/or design time may be reduced for a given implementation because time and effort is not required for implementing a high-precision clock signal generator and silicon validation/re-design.

According to one embodiment, the self-timed multi-ported memory system (e.g., register file) is implemented effectively as a high-speed "domino" implementation. Domino logic is well-known and conventionally employed in Complementary metal-oxide-semiconductor (CMOS) circuits. In general, domino logic refers to logic that employs multiple phases for memory cell accesses. In domino memory cells, for example, a first phase generally comprises a pre-charge phase, and then an evaluate phase follows thereafter. For instance, a domino memory system may comprise memory cells that each have a latch (e.g., a back-to-back arrangement of inverters) for storing a bit of data (e.g., either a "0" or a "1"), and the domino memory system further comprises a bit line on which data to be read from or written to the memory cell is placed. In the pre-charge phase of the domino memory system, the bit line is generally pre-charged high. Thus, irrespective of the data currently stored to the latch of a memory cell to be read or the data to be written to the latch of a memory cell, the bit line is initially pre-charged high. Then, in the evaluate phase, the pre-charge circuitry is turned off so that the bit line is allowed to either discharge to a "0" or remain charged to a "1" depending on the data value to be read from or written to the memory cell.

Domino logic is a known circuit style that allows for high-speed operations. One of the things that often plagues a domino system is what is known as a false discharge event, wherein for a particular operation the system may falsely discharge the domino stack. For instance, in the above-described implementation, the bit line may be falsely discharged after the pre-charge circuitry is turned off. Without the pre-charge circuitry turned on, there is conventionally no way to recover from a false discharge event, thus resulting in incorrect data being presented to the bit line. Such discharge events are discussed further herein.

Embodiments of the present disclosure relate generally to generation and completion of read and write operations using self-timing in a multi-ported register file. Certain embodiments allow for operating the register file without any dependence on clock duty cycle, as discussed further herein.

According to one embodiment, when a certain agent wants to write to a location in the multi-ported register file and another agent wants to read from the location, the self-timed multi-ported register file is implemented to make sure that the write occurs before the read happens so that the agent that is reading always has the latest data. And, this is performed in a self-timed manner to ensure that the write operation has completed before the read operation launches. Because reads occur after writes have completed in certain embodiments, the above-mentioned false domino discharge problem is eliminated, thus allowing for same cycle, same address read/write operation. Read after write self-timing allows for unrestricted operation of the read/write ports without a need for data-forwarding in the event of read/write collision to the same address in the same cycle. Thus, the robustness of the timing loop is maintained.

For instance, in one embodiment, the multi-ported memory system (e.g., register file) employs a self-timing loop for synchronizing operations within the memory system. Such self-timing loop employs a write operation to a "dummy cell" of the memory array, the completion of which triggers a read operation to a dummy cell of the memory array. The dummy cells may be dedicated cells within the memory array, which may be located at corner locations within the array relative to other memory cells in the array, as discussed further herein. The self-timing loop is triggered upon receipt of a memory access request on any one or more of the ports of the multi-ported memory system, and the self-timing loop is used for synchronizing internal operations of the memory for satisfying the received access request. In certain embodiments, a single self-timing loop is used for synchronizing memory access operations for all of the ports of the memory. For instance, one port may be presenting a read access request while another port is presenting a write access request, and the self-timing loop is used for synchronizing operations for both of the ports. In addition, as discussed further herein, the read access request and write access request being presented at a given time by the two ports may be requests to access the same memory address. The self-timing loop enables both accesses to be satisfied in a single clock cycle by referencing the self-timing loop to first perform the write access and then the read access upon completion of the write access (which may be determined with reference to the completion of the "dummy write" operation in the self-timing loop).

As described further herein, certain embodiments of the self-timed multi-ported register file remove clock duty dependency from the implementation. Also, in certain embodiments, the read and write timings automatically track PVT variations. Further, certain embodiments allow for tight packing of timing events for read/write operations, thereby building in the implementation frequency "headroom" (with reference to the frequency of an external clock used by other system components that access the memory). Certain embodiments allow for low power operation due to sharing of the self-timed loop across multiple ports. In addition, as discussed further herein, certain embodiments allow for adjustable timing loop delay using programmable accelerator (ACC) bits for improving yield and timing margins. As mentioned above, certain embodiments eliminate false domino discharge by ensuring write operations complete before read operations are started. And, certain embodiments allow for unrestricted port operation, wherein read and write operations to the same address can be performed in the same cycle. These and other features and benefits of certain embodiments of the self-timed multi-ported register file are described further herein.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying drawing.

DETAILED DESCRIPTION

Figure 1:
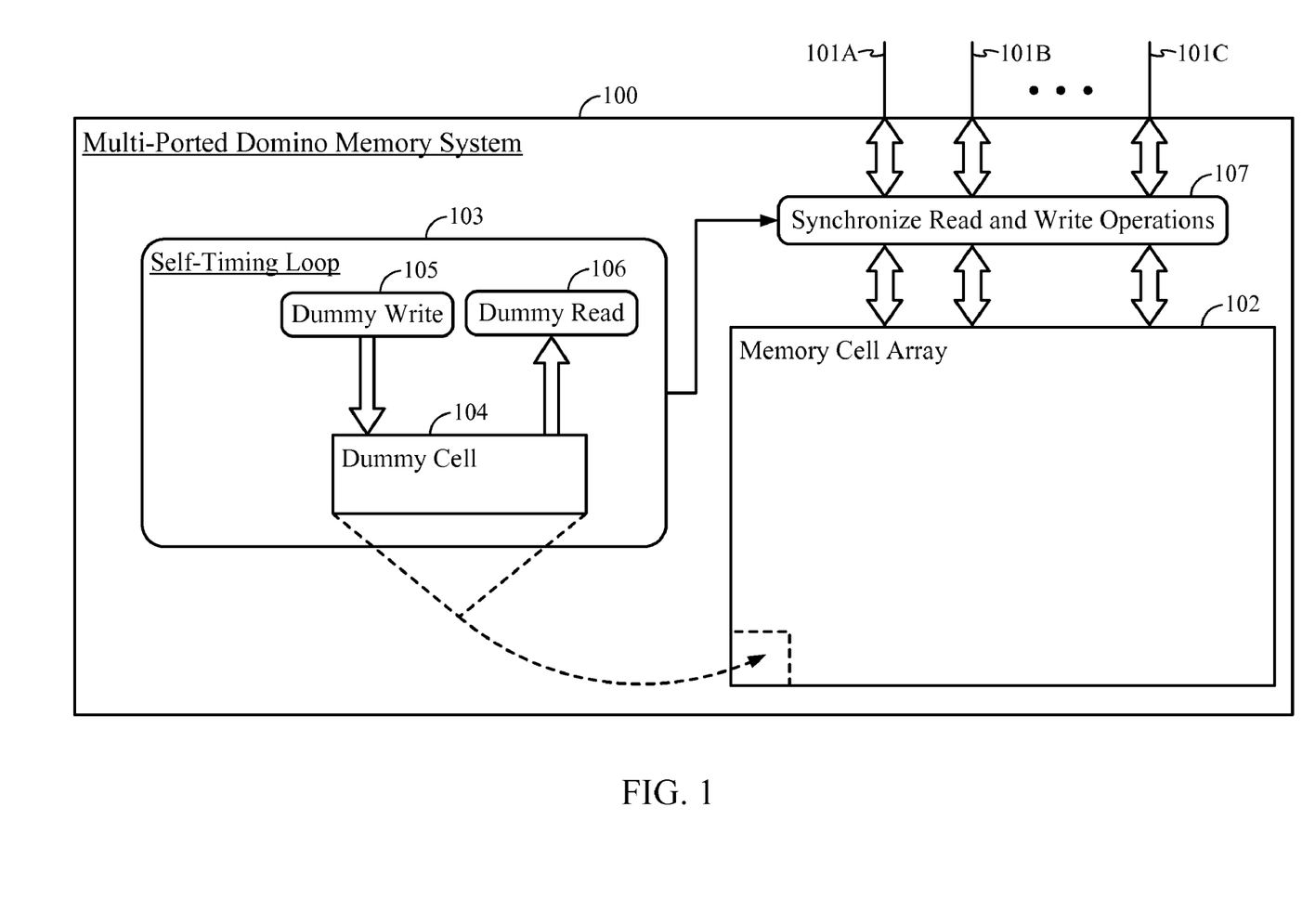
FIG. 1 shows a block diagram of an exemplary multi-ported memory system.

FIG. 1 shows a block diagram of an exemplary multi-ported memory system 100 according to one embodiment of the present disclosure. Multi-ported memory system 100 is a "domino" memory system. That is, memory system 100 employs domino logic for implementing the memory cells. Domino logic is well-known and commonly employed in Complementary metal-oxide-semiconductor (CMOS) circuits. In general, domino logic refers to logic that employs multiple phases for the memory cells. In domino memory cells, for example, a first phase generally includes a pre-charge phase, and then an evaluate phase follows thereafter. For instance, a domino memory system may have memory cells that each have a latch (e.g., a back-to-back arrangement of inverters) for storing a bit of data (e.g., either a "0" or a "1"), and the domino memory system also has a bit line on which data to be read from or written to the memory cell is placed. In the pre-charge phase of the domino memory system, the bit line is pre-charged high. Thus, irrespective of the data currently stored to the latch of a memory cell to be read or the data to be written to the latch of a memory cell, the bit line is initially pre-charged high. Then, in the evaluate phase, the pre-charge circuitry is turned off so that the bit line is allowed to either discharge to a "0" or remain charged to a "1" depending on the data value to be read from or written to the memory cell.

Multi-ported domino memory system 100 has an array 102 of such domino memory cells. Multi-ported domino memory system 100 also has multiple access ports 101A, 101B, 101C that enable memory access (e.g., read and write access) to the memory cells 102. While three ports are shown for illustration in system 100, any number n (that is 2 or more) may be implemented in a given architecture. Each port may be used simultaneously for performing independent memory access operations.

According to embodiments of the present disclosure, multi-ported memory system 100 employs a self-timing loop 103 for synchronizing 107 its internal memory access operations. That is, as discussed further herein, the operations involved with satisfying read and/or write access requests being received via ports 101A-101C for accessing memory cell array 102 are synchronized 107 with reference to self-timing loop 103.

According to certain embodiments of the present disclosure, self-timing loop 103 comprises performance of a dummy write operation 105 to a dummy cell 104 and performance of a dummy read operation 106 from a dummy cell 104. While the write operation 105 and read operation 106 are shown in this example as being performed on a same dummy cell 104, in certain embodiments different dummy cells may be used for the write operation 105 and read operation 106.

According to embodiments of the present disclosure, the self-timing loop 103 may be triggered upon receipt by memory system 100 of a memory access request via any one or more of the ports 101A-101C. In one embodiment, the self-timing loop 103 is used for synchronization 107 of memory access events by first performing the dummy write operation 105 to dummy cell 104, during which any write operation requests that are present on ports 101A-101C are performed. In one embodiment, the dummy cell 104 is arranged within memory cell array 102 at a high-latency access cell (i.e., corner) location (as compared with other cell locations within array 102), whereby the dummy write operation 105 and any "actual" write operations present on ports 101A-101C are launched together. In this manner the actual write operations (to non-dummy cells of array 102) should complete by the time the dummy write operation 105 completes.

Completion of the dummy write operation 105 triggers dummy read operation 106. Completion of the write operation 105 also triggers any "actual" read operations present on ports 101A-101C. In this way, such synchronization 107 ensures that write operations present on ports 101A-101C are completed before read operations present on ports 101A-101C are launched. Accordingly, in certain embodiments, this synchronization may enable both a write operation and a read operation to be performed on a same memory address in a common clock cycle, as discussed further herein. Again, because the dummy cell 104 is arranged within memory cell array 102 at a corner location (as compared with other cell locations within array 102), the actual read operations (to non-dummy cells of array 102) should complete by the time the dummy read operation 106 completes. Therefore, completion of dummy read operation 106 should indicate that the actual read operations present on ports 101A-101C have been completed and any following actions in the memory system can then be triggered, such as re-enabling pre-charge circuitry to pre-charge the bit line.

Thus, a high-precision clock generator (e.g., PLL) is not required to be implemented for use by multi-ported domino memory system 100 for its internal operations. Of course, other logic may employ a clock signal, such as microprocessors and/or other logic requesting access to memory system 100. Because the internal operations within multi-ported domino memory system 100 are self-timed (rather than synchronized to such a clock signal), multiple access operations may be performed within memory system 100 in a single clock cycle that have conventionally been required to be distributed across multiple clock cycles. For instance, as discussed above, certain embodiments of the present disclosure enable both a write operation and a read operation to be performed on a same memory address in a common clock cycle, whereas these operations have, in conventional multi-ported memory systems that are synchronized to a clock signal, been required to be separated into different clock cycles.

Also, application designers and/or system designers have conventionally been required to design applications or safeguards to ensure that a write to a given address is completed before a read to that address is performed to ensure that the read obtains up-to-date data. Embodiments of the present disclosure alleviate much of that design burden because the self-timing loop 103 ensures that a write to a given address will complete before a read to that address is performed.

Further, false discharge events have traditionally plagued domino memory systems. As an example of a false discharge event that might otherwise be encountered, suppose that a memory cell holds a "1" when both a read and write operation are received at the same address during the same cycle, where the write desires to write a "0" to the cell; if the read operation were performed first, then the pre-charge circuitry is turned off to enable the bit line to discharge to "0" so the "0" value present in the memory cell is read out. After a successful "0" write operation, the data read out is the previous value ("1") instead of the new value ("0"). Embodiments of the present disclosure eliminate such false discharge events by ensuring that a write to a memory cell is performed before a read to the memory cell.

Also, according to certain embodiments, the self-timing loop 103 is only triggered upon a read or write access request being present on at least one of ports 101A-101C, thus conserving power consumption during any clock cycles in which a memory access request is not present on at least one of the ports. Further, in certain embodiments, the single self-timing loop 103 is leveraged for synchronizing access operations for all of the ports 101A-101C. Additionally, PVT variations do not disrupt operation of the exemplary self-timed memory system 100.

Figure 2:
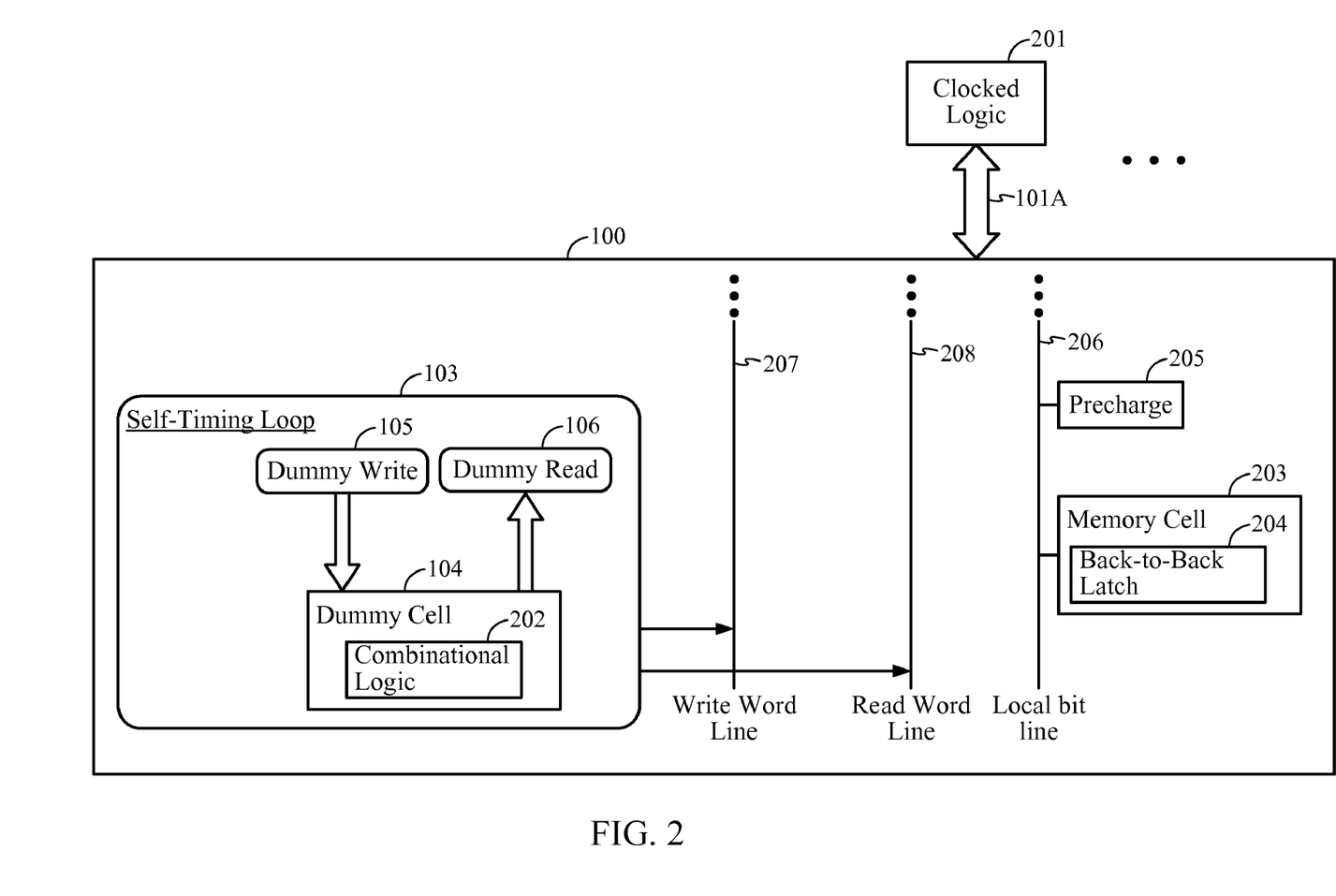
FIG. 2 shows another block diagram of an exemplary multi-ported memory system.

Turning to FIG. 2, another block diagram of an exemplary multi-ported memory system 100 according to one embodiment of the present disclosure is shown. In this example, clocked logic 201 (e.g., a microprocessor) is requesting memory access operation(s) via port 101A to memory system 100.

In this example, memory system 100 includes a local bit line 206, a write word line 207, and a read word line 208. These word lines 206-208 are common in memory systems, and are thus only briefly described herein. In general, a bit line 206 is a line on which data to be read from or written to a memory cell 203 (e.g., of array 102 of FIG. 1) is placed. Memory cell 203 commonly comprises a latch 204 implemented by back-to-back inverters. In a pre-charge phase, the bit line 206 is generally pre-charged high by pre-charge circuitry 205. Thus, irrespective of the data currently stored to the latch 204 of memory cell 203 to be read or the data to be written to the latch 204 of memory cell 203, the bit line 206 is initially pre-charged high. Then, in an evaluate phase, the pre-charge circuitry 205 is turned off so that the bit line 206 is allowed to either discharge to a "0" or remain charged to a "1" depending on the data value to be read from the memory cell 203.

Write word line 207 and read word line 208 are used to indicate the type of memory access operation to be performed. For instance, write word line 207 may be pulled high when the data present on local bit line 206 is to be written to memory cell 203, and read word line 208 may be pulled high when the data present on local bit line 206 is the data read from memory cell 203.

As discussed further herein, in embodiments of the present disclosure, the self-timing loop 103 may be triggered upon receipt by memory system 100 of a memory access request via any one or more of the system's ports, such as port 101A. In some embodiments, only a read request triggers the self timing loop. As discussed above with reference to FIG. 1, the self-timing loop 103 is used for synchronization of memory access events by first performing the dummy write operation 105 to dummy cell 104, during which any write operation requests that are present on ports 101A-101C are performed, and then performing a dummy read operation 106, during which any read operation requests that are present on ports 101A-101C are performed.

Thus, in the example of FIG. 2, the self-timing loop 103 is used for controlling the firing of write word line 207 and/or read word line 208. For instance, if a write to memory cell 203 is present on port 101A (or any other port), then write word line 207 is asserted (e.g., transitioned high) in synchronization with the performance of dummy write operation 105 to trigger the writing of the data present on bit line 206 to memory cell 203. If a read from memory cell 203 is present on port 101A (or any other port), then read word line 208 is asserted in synchronization with the performance of dummy read operation 106 to trigger the reading of the data present in memory cell 203 via bit line 206.

In the example of FIG. 2, dummy cell 104 includes combinational logic for implementing its latch. That is, rather than employing a back-to-back latch (as in latch 204 that is implemented in the non-dummy memory cells, such as memory cell 203), dummy cell 104 may comprise a latch that is implemented employing only combinational logic. Conventionally, a back-to-back latch implementation is employed where each side of the back-to-back latch effectively fights with each other (e.g., one side tries to pull the latch low, while the other side tries to pull the latch high). In certain embodiments of the present disclosure, a dummy cell 104 is employed that eliminates the back-to-back latch and instead employs only combinational logic for implementing the latch.

Figure 3:
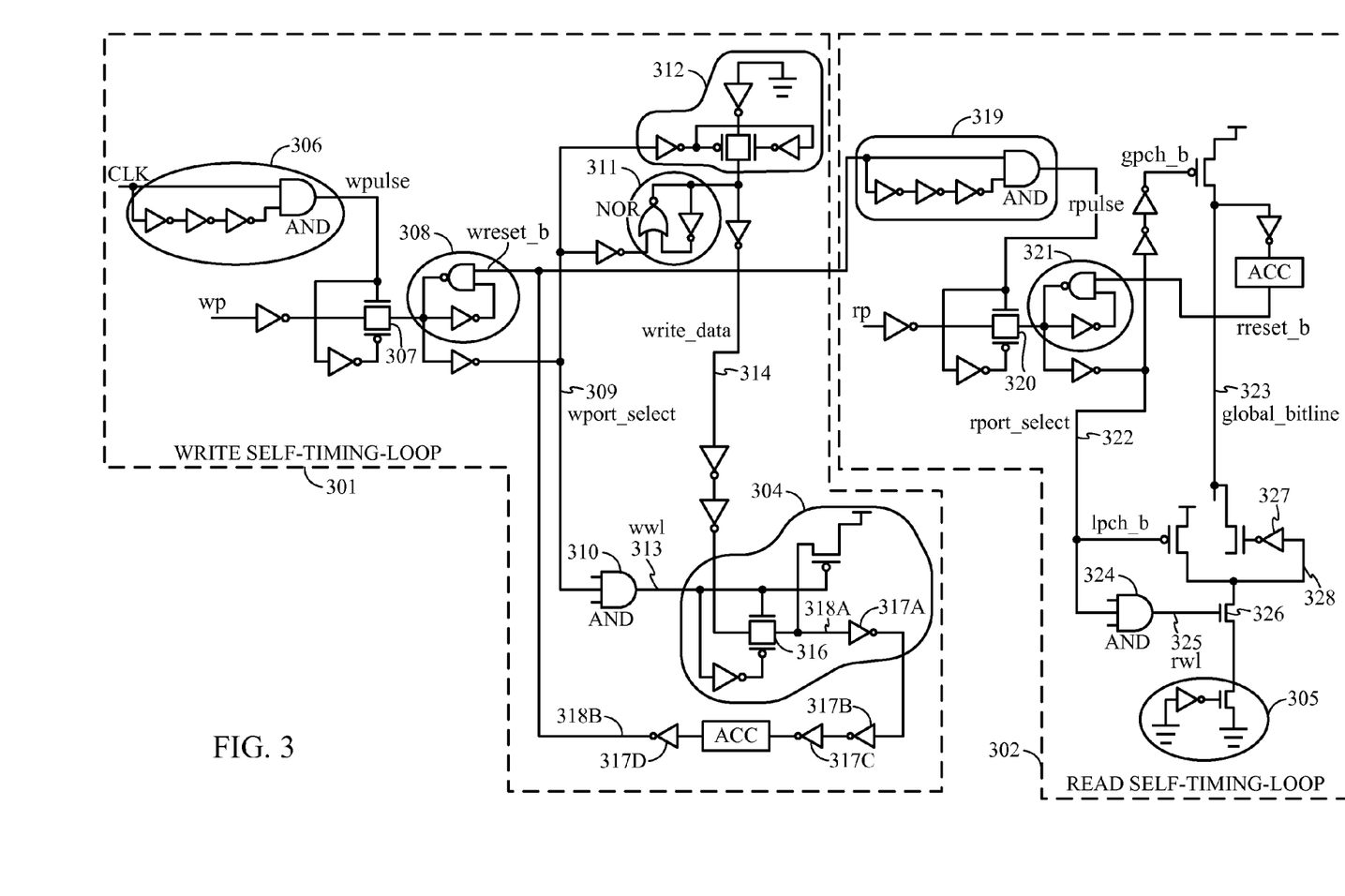
FIG. 3 shows an exemplary implementation of a memory array of a multi-ported memory system.

FIG. 3 shows an exemplary implementation of memory array of a multi-ported memory system according to one embodiment of the present disclosure. As shown, the exemplary memory array of FIG. 3 includes a write self timing loop 301 and a read self timing loop 302. In addition, the exemplary memory array of FIG. 3 includes a write dummy cell 304 and a read dummy cell 305. The above-mentioned self-timing loop 103 performs a write 105 to the write dummy cell 304 and a read 106 to the read dummy cell 305 for synchronization of memory access events to satisfy memory access requests that may be present on one or more of the ports. The dummy write cell 304 and dummy read cell 305 are arranged at high-latency access locations relative to other cells within the memory array.

A write pulse generator 306 generates a write pulse WPULSE in response to a clock signal CLK to open a transmission gate 307. If a write is to occur, a write port signal WP is generated, The write port signal WP passes through the open transmission gate 307 into a write port latch 308 and is also provided to a write port select line 309. The write port signal WP transmitted through the pass gate 37 will be referred to as a write port select signal wport_select.

The write port select signal wport_select is inverted and stored in a portion of a write data latch 311. The write port select signal wport_select also controls another portion of the write data latch 312 which provides a write data signal write_data onto a dummy write bit line 314.

Concurrently, a decoder 310 receives the write port select signal wport_select, as well as two always high signals. Based upon the always high signals and the received write port select signal wport_select, a dummy write word line 313 is asserted.

In this example of FIG. 3, as discussed further below, the write dummy cell 304 replaces the conventional back-to-back latch (such as back-to-back latch 204 of FIG. 2) and instead employs only combinational logic. In certain embodiments, multiple ports are implemented for accessing memory 102. For instance, four read ports and four write ports may be implemented. Each of the ports may have a corresponding port select line that is asserted when the port desires to perform a memory access operation. In addition, in this exemplary embodiment, the write port signal WP and a read port signal RP are provided for triggering the self-timing loop when any one or more of the read or write port select lines are asserted. Thus, when a memory access request is present on any of the ports of the memory (e.g., any of its eight ports in the above-mentioned example), the write port select signal wport_select and a read port select signal rport_select control the self-timing loop in the manner described further below.

As discussed above, embodiments of the present disclosure implement a self-timing loop in which a dummy write operation is performed before a dummy read operation. Events within the memory system for satisfying actual write and read operations via the actual ports of the multi-ported memory system are synchronized with reference to the self-timing loop. Thus, in response to a port select line being asserted for any one or more of the actual ports of the multi-ported memory system in a given clock cycle, the write port signal WP triggers, asserting the write port select signal wport_select. The dummy write word line 313 for the dummy write cell 304 is then asserted.

The dummy write cell 304 in this example is modified compared to a typical back-to-back memory cell. Here, the dummy write cell 304 does not include a feedback device, and without a feedback device, this cell is effectively implemented as combinational logic. Thus, there is no contention between back-to-back inverters as is typically present in memory cells (and, as may be present in non-dummy cells of array 102). In general, it is desirable to implement the dummy self-timing loop in a robust manner such that the dummy cells (e.g., cell 304) employed for the self-timing operations do not fail. This exemplary embodiment improves robustness of the dummy write cell 304 by making the path as combinational as feasible so signals within the dummy write cell 304 pass from one gate to another gate without "fighting" gates along the way.

After the dummy write word line 313 is asserted, a transmission gate 316 opens, and then the write data signal write_data from the dummy write bit line 314 comes through. In this example, the dummy write bit line 314 writes a "0" to the dummy write cell 304. In other words, the dummy write cell 304 is previously pre-charged to a "1", and the dummy write bit line 314 writes a "0" to this dummy write cell 304.

In this example, four sets of forward-facing inverters 317A-317D are implemented. Of course, in other embodiments any even number of such forward-facing inverters may be similarly implemented to achieve timing desired for the given implementation. According to certain embodiments, timing for transitioning a write reset signal wreset_b may be controlled/modulated by a programmable delay (programmable acceleration logic (ACC)) setting in the system.

A "0" at point 318A results in a "0" on the write reset line 318B in this example. A "0" on the write reset line 318B triggers a reset event (i.e., the write reset signal wreset_b deasserts), which turns off or resets the write port signal WP. Thus, upon completion of the dummy write operation, the write port signal WP is deselected by resetting its corresponding latch 308. In synchronization, a reset event for the write port also signals that any actual writes being performed on actual write ports of the memory should be complete, and thus reset events may likewise be triggered for those actual write ports in certain embodiments. Moreover, the reset propagates via the write port select line 309 to deselect the dummy word line 313, and reset both portions of the write data latch 311, 312, setting the dummy write bit line 314 to "1".

If any read access requests are present on the actual read ports of the memory, then the completion of the dummy write event triggers a dummy read event. More specifically, the write reset signal wreset_b going low triggers a read pulse generator 319 to assert a read pulse signal rpulse, opening a transmission gate 320. The read port signal RP then passes through the transmission gate 320 into a read port latch 321 and a read port select line 322 transitioning a read port select signal rport_select high. Global pre-charge and local pre-charge signals gpch_b, lpch_b are deasserted in response to the read port select signal rport_select going high. Concurrently, an address decoder 324 receives the read port select signal rport_select, as well as two always high signals. Based upon the always high signals and the received read port select signal rport_select, a dummy read word line (rwl) 325 is asserted.

In response to the dummy read word line 325 going high, a read port 326 opens, discharging a local read bit line 328 to ground. In other words, the dummy read cell 305 is able to discharge the local read bit line 328. Subsequently, output of an inverter 327 goes high, causing a global bit line 323 to discharge to ground. In response, a read reset signal rreset_b goes low, resetting the read port latch 321, which in turn resets the read port select signal rport_select. Consequently, the local and global pre-charge operations begin and the dummy read word line 325 resets. According to certain embodiments, the timing for transitioning the read reset signal rreset_b may be controlled/modulated by a programmable delay (programmable acceleration logic (ACC)) setting in the system.

Figure 4:
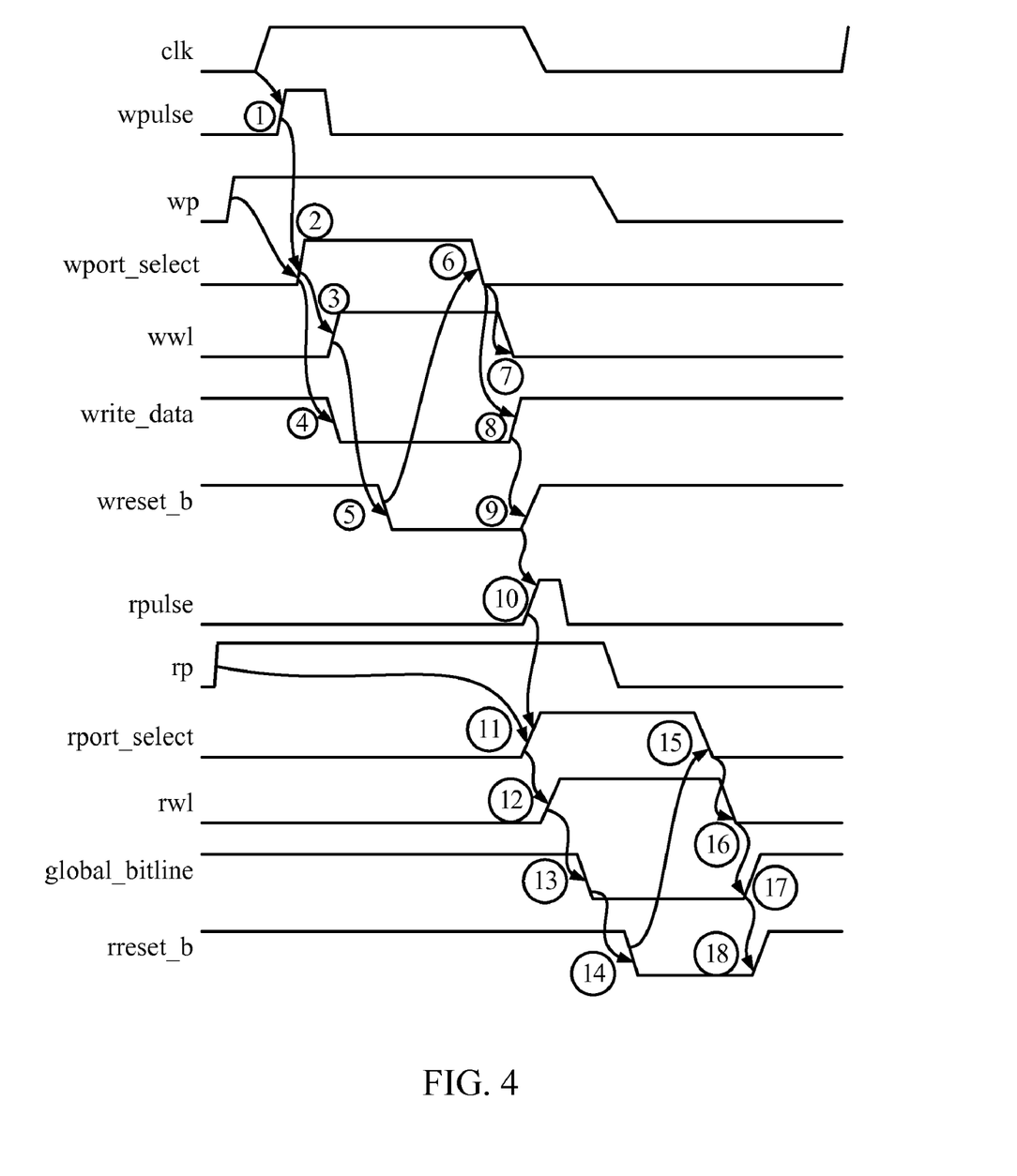
FIG. 4 shows a timing diagram for various signal lines shown in FIG. 3, which illustrate their relationship during a self-timing loop.

FIG. 4 shows a timing diagram for various signals shown in FIG. 3, which illustrate their relationship during a self-timing loop according to embodiments of the present disclosure. As shown, relative to a rising edge of a clock signal (CLK) (that is referenced by other components of the system that request memory access), any requests that are present on one or more ports of the memory system are detected. If a read request is present on any of the read ports (RP=high) or a write request is present on any of the write ports (WP=high), then the self-timing loop is triggered, otherwise power is conserved by not triggering the self-timing loop operations.

When the write self-timing loop is triggered, the clock signal CLK initiates the write pulse signal WPULSE at time 1. This, in combination with the write pulse signal WP triggers the write port select signal wport_select to be asserted at time 2, which causes the dummy write word line 313 to transition high at time 3. As also shown in FIG. 4, the write port select signal wport_select transitioning high causes the write data signal write_data to transition low at time 4 for writing a "0" to the dummy memory cell 304. And, such writing of the "0" data in dummy write cell 304 causes the wreset_b signal to transition low at time 5, thereby resetting the write port select signal at time 6, as discussed above. In response, to the write port select signal wport_select going low at time 6 the dummy write word line 313 is reset at time 7 and the dummy bit line (write_data) goes high at time 8. When the write data signal write_data transitions high, at time 9 the write reset signal wreset_b transition high via the dummy write cell 304.

If a read operation has also been selected, the read port signal RP is high, and the wreset_b signal transitioning high triggers the read pulse signal rpulse at time 10. The combination of the read port signal RP being high and the read pulse signal rpulse being high triggers the dummy read port select signal rport_select to be asserted at time 11, which turns off the global precharge signal (gpch_b) and also deselects the local precharge signal (lpch_b) and causes the dummy read word line (rwl) 325 to transition high, at time 12, for triggering a read of a "0" from the dummy read cell 305. And, such reading of a "0" from dummy read cell 305 causes the dummy read cell 305 to discharge the global bit line 323 at time 13, which causes the read reset signal rreset_b to transition low at time 14, for resetting the read port select signal rport_select by resetting the read port latch 321. That is, at time 15 the dummy read port select signal rport_select goes low causing the dummy read word line (rwl) 325 to shut off (time 16), activating the local precharge and the global precharge and thus charging the local and global bit lines 328, 323 at time 17. In response, the read reset signal rreset_b goes high at time 18. As mentioned above, the time for asserting the read reset signal rreset_b to transition high may be modulated depending on programmable delay.

Figure 5:
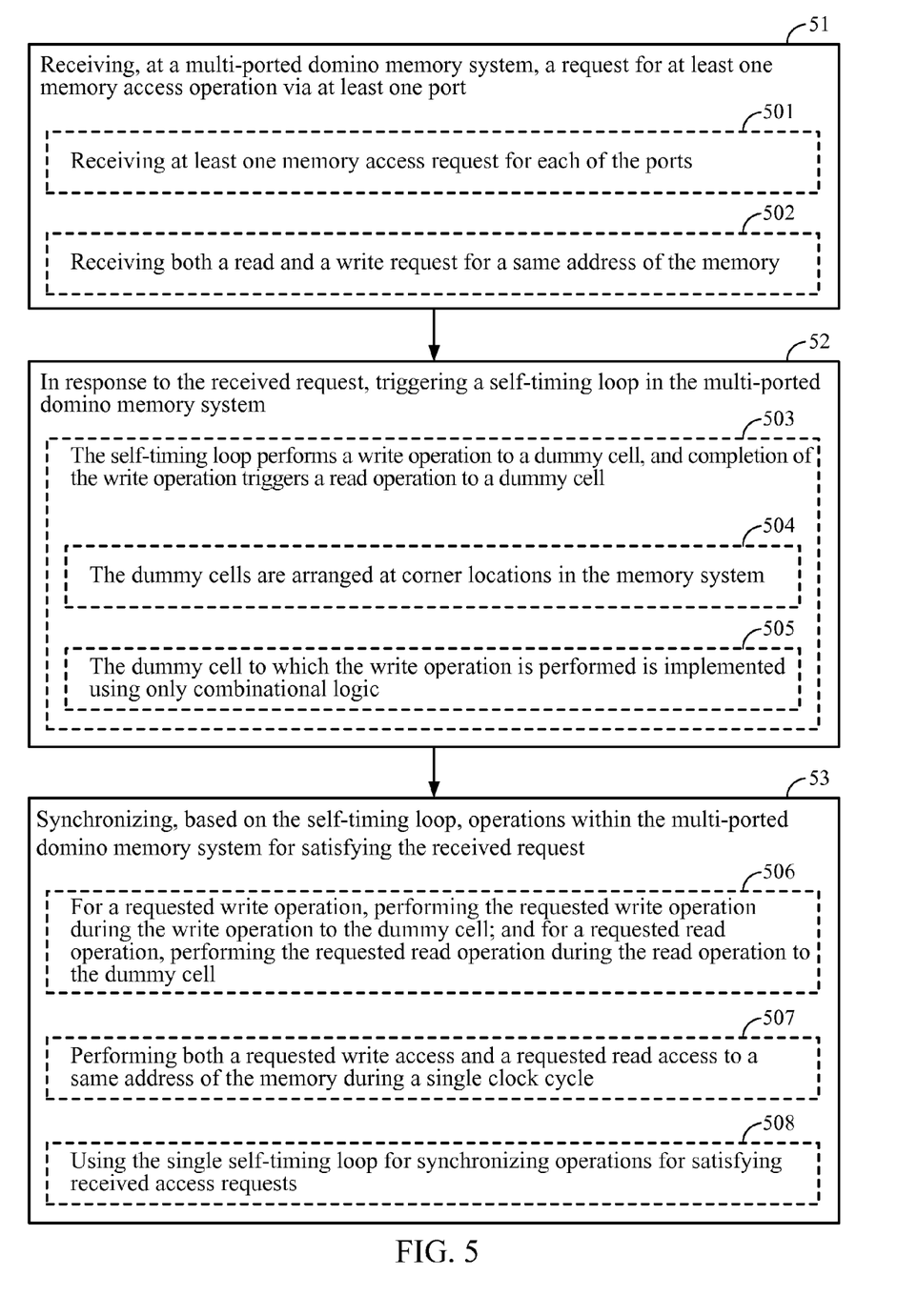
FIG. 5 shows an exemplary operational flow diagram.

FIG. 5 shows an exemplary operational flow diagram according to certain embodiments of the present disclosure. In operational block 51, a multi-ported domino memory system receives a request for at least one memory access operation via at least one of the ports. For instance, a write and/or read access request may be received via the ports. As illustrated in sub-block 501, in some instances at least one memory access request is received on each of multiple ports. Thus, at a given instance multiple memory access requests may be pending for satisfaction by the memory system. As illustrated in sub-block 502, in some instances both a read and write request for a same address of the memory may be received.

In operational block 52, in response to the received request, a self-timing loop is triggered in the multi-ported domino memory system. As shown in sub-block 503, in certain embodiments, the self-timing loop performs a write operation to a dummy cell, where completion of the write operation triggers a read operation to a dummy cell. Further, in certain embodiments, the dummy cells are arranged at corner locations in the memory system, as indicated in sub-block 504. Also, in certain embodiments, the dummy cell to which the write operation is performed is implemented using only combinational logic (as opposed to use of a back-to-back latch, for instance), as indicated in sub-block 505.

In operational block 53, operations within the multi-ported domino memory system for satisfying the received request(s) are synchronized based on the self-timing loop. For instance, in certain embodiments, any requested write operation present on any of the ports is performed during the write operation to the dummy cell, and any requested read operation present on any of the ports is performed during the read operation to the dummy cell, as indicated in sub-block 506. As indicated in sub-block 507, in certain embodiments both a requested write access and a requested read access to a same address of the memory can be performed during a single clock cycle (of a clock used by logic requesting the memory accesses). And, as indicated in sub-block 508, in certain embodiments a single self-timing loop is used for synchronizing operations for satisfying the received memory access requests across the ports.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" or "low" and logical "1" or "high" in certain locations, one skilled in the art appreciates that the logical values can be switched, with the remainder of the circuit adjusted accordingly, without affecting operation of the present disclosure.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for controlling a multi-ported domino memory system, the method comprising:
   receiving at least one memory access request via at least one port of the multi-ported domino memory system;
   triggering a self-timing loop of events in the multi-ported domino memory system responsive to the receiving at least one memory access request; and
   synchronizing operations within the multi-ported domino memory system for satisfying the received at least one memory access request based on the self-timing loop.

2. The method of claim 1 wherein the multi-ported domino memory system is a register file.

3. The method of claim 1 wherein the multi-ported domino memory system employs a pre-charge phase and an evaluate phase for memory access operations.

4. The method of claim 1 wherein the self-timing loop of events comprises performing a write to a cell of the memory and performing a read of a cell of the memory.

5. The method of claim 4 wherein the self-timing loop of events performs the write first, and completion of the write triggers the read.

6. The method of claim 5 wherein the synchronizing operations comprises:
   performing any write operation of the received at least one memory access request during the write of the self-timing loop; and
   performing any read operation of the received at least one memory access request during the read of the self-timing loop.

7. The method of claim 6 wherein the received at least one memory access request comprises a write and a read to a same address of the memory, the method further comprising:
   performing the write and the read to the same address of the memory during a single cycle of a clock referenced by logic requesting the write and the read to the same address.

8. The method of claim 4 wherein the write is to a dedicated dummy cell of the memory system.

9. The method of claim 8 wherein the multi-ported memory system comprises an array of memory cells, the array comprising a plurality of non-dummy cells that are accessed for satisfying actual memory access requests received via ports of the multi-ported memory system.

10. The method of claim 9 wherein the dedicated dummy cell is arranged in the array at a corner access location relative to the non-dummy cells of the array.

11. The method of claim 9 wherein the dedicated dummy cell has a different structure than the non-dummy cells.

12. The method of claim 11 wherein the non-dummy cells each comprise a back-to-back latch, and wherein the dedicated dummy cell does not include a back-to-back latch.

13. The method of claim 11 wherein the dedicated dummy cell comprises only combinational logic.

14. A method comprising:
   receiving at least one memory access request via at least one port of a multi-ported domino memory system;

response to the receiving, triggering a self-timing loop in the multi-ported domino memory system, wherein the self-timing loop comprises performing a write to a cell of the memory and, responsive to completion of the write, performing a read of a cell of the memory; and synchronizing performance of any write operation included in the received at least one memory access request with the write of the self-timing loop, and synchronizing performance of any read operation included in the received at least one memory access request with the read of the self-timing loop.

15. The method of claim 14 wherein the received at least one memory access request comprises a write and a read to a same address of the memory, the method comprising:

performing the write and the read to the same address of the memory during a single cycle of a clock referenced by logic requesting the write and the read to the same address.

16. The method of claim 14 wherein the multi-ported domino memory system comprises an array of memory cells; the array comprising a plurality of non-dummy cells that are accessed for satisfying actual memory access requests received via ports of the multi-ported domino memory system, and the array comprising a dedicated dummy cell arranged in the array at a corner access location relative to the non-dummy cells of the array; and wherein the write of the self-timing loop is to the dedicated dummy cell.

17. The method of claim 16 wherein the non-dummy cells each comprise a back-to-back latch, and wherein the dedicated dummy cell does not include a back-to-back latch.

18. The method of claim 14 wherein the multi-ported domino memory system employs a pre-charge phase and an evaluate phase for memory access operations.

19. The method of claim 18 wherein a bit line of the multi-ported domino memory system is pre-charged by pre-charge circuitry in the pre-charge phase; and wherein the pre-charge circuitry is turned off during the evaluate phase to enable the bit line to either remain charged or to discharge depending on a data value to be read from a memory cell or written to the memory cell in a memory access operation.

20. A multi-ported memory system comprising:
multiple ports for receiving memory access requests;
an array of memory cells, the array comprising non-dummy cells accessible for satisfying received memory access requests, and the array comprising at least one dummy cell; and
wherein the non-dummy cells each comprise a back-to-back latch, and wherein the at least one dummy cell does not include a back-to-back latch.

21. The multi-ported memory system of claim 20 wherein the memory system is a domino-based system in which memory accesses comprise at least a pre-charge phase and an evaluate phase.

22. The multi-ported memory system of claim 21 wherein a bit line of the domino-based system is pre-charged by pre-charge circuitry in the pre-charge phase; and wherein the pre-charge circuitry is turned off during the evaluate phase to enable the bit line to either remain charged or to discharge depending on a data value to be read from a memory cell or written to the memory cell in a memory access operation.

23. The multi-ported memory system of claim 20 wherein the at least one dummy cell consists of combinational logic.

24. The multi-ported memory system of claim 20 wherein the at least one dummy cell is arranged at a corner location in the array relative to the non-dummy cells.

25. The multi-ported memory system of claim 20 further comprising:
logic that, in response to receiving at least one memory access request on at least one of the ports, triggers a self-timing loop in the multi-ported memory system; wherein the self-timing loop comprises performing a write to one of the at least one dummy cell and, responsive to completion of the write, performing a read of one of the at least one dummy cell.

26. The multi-ported memory system of claim 25 further comprising:
logic that synchronizes performance of any write operation included in the received at least one memory access request with the write of the self-timing loop, and that synchronizes performance of any read operation included in the received at least one memory access request with the read of the self-timing loop.

27. A method comprising:
receiving, via at least one port of a multi-ported domino memory system, at least one memory access request from clocked logic that operates based on a clock signal, wherein in a common clock cycle the at least one memory access request received comprises a write and a read to a same address of the memory;
triggering a self-timing loop of events in the multi-ported domino memory system; and
synchronizing operations within the multi-ported domino memory system for satisfying the received at least one memory access request based on the self-timing loop, wherein the write and the read to the same address of the memory are performed during a single cycle of the clock.

28. The method of claim 27 wherein the self-timing loop of events comprises performing a write to a cell of the memory and performing a read of a cell of the memory.

29. The method of claim 28 wherein the self-timing loop of events performs the write first, and completion of the write triggers the read.

30. The method of claim 29 wherein the synchronizing operations comprises:
performing the write operation to the same address during the write of the self-timing loop; and
performing the read operation of the same address during the read of the self-timing loop.

* * * * *